(12) United States Patent
Ju

(10) Patent No.: US 10,141,677 B2
(45) Date of Patent: Nov. 27, 2018

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/805,296

(22) Filed: Nov. 7, 2017

(65) Prior Publication Data

US 2018/0145441 A1    May 24, 2018

(30) Foreign Application Priority Data

Nov. 23, 2016  (CN) ..................... 2016 2 1259164 U

(51) Int. Cl.
| | |
|---|---|
| H01R 12/00 | (2006.01) |
| H01R 13/514 | (2006.01) |
| H01R 12/70 | (2011.01) |
| H01R 12/82 | (2011.01) |
| H01R 13/516 | (2006.01) |
| H01L 23/00 | (2006.01) |
| H05K 7/10 | (2006.01) |

(52) U.S. Cl.
CPC ........... *H01R 13/514* (2013.01); *H01L 23/00* (2013.01); *H01R 12/7076* (2013.01); *H01R 12/82* (2013.01); *H01R 13/516* (2013.01); *H05K 7/10* (2013.01)

(58) Field of Classification Search
CPC .................................................. H01R 13/514
USPC ........................................... 439/70, 71, 701
See application file for complete search history.

(56) References Cited

U.S. PATENT DOCUMENTS

| | | | | |
|---|---|---|---|---|
| 3,805,212 A | * | 4/1974 | Landman | H05K 7/1076 361/767 |
| 4,550,959 A | * | 11/1985 | Grabbe | H05K 3/303 29/843 |
| 4,552,422 A | * | 11/1985 | Bennett | H05K 7/1084 361/783 |
| 4,606,725 A | * | 8/1986 | Chio | G09B 23/186 434/224 |

(Continued)

FOREIGN PATENT DOCUMENTS

| | | |
|---|---|---|
| CN | 200959416 Y | 10/2007 |
| CN | 201029150 | 2/2008 |

(Continued)

*Primary Examiner* — Neil Abrams
(74) *Attorney, Agent, or Firm* — Locke Lord LLP; Tim Tingkang Xia, Esq.

(57) ABSTRACT

An electrical connector includes an insulating body, which has at least two body units. Each two body unit accommodates and is fixed with multiple terminals, and the at least two body units are spliced to each other. Each body unit has at least two edge portions, and the insulating body is provided with at least four fixing portions such that each of the edge portions is provided with at least one fixing portions. At least four metal members are correspondingly and fixedly provided on the at least four fixing portions respectively. At least two metal sheets are provided outside the at least two body units. Each metal sheet is soldered and fixed to at least one metal member provided on each body unit. By soldering and fixing the metal members and the metal sheets together, the overall structure of the electrical connector is firmer, and flatness is higher.

13 Claims, 8 Drawing Sheets

(56) References Cited

U.S. PATENT DOCUMENTS

| | | | | |
|---|---|---|---|---|
| 5,329,227 A * | 7/1994 | Sinclair | G01R 1/0433 | 324/756.02 |
| 5,443,404 A * | 8/1995 | Matsuoka | H05K 7/1023 | 439/331 |
| 5,511,138 A * | 4/1996 | Lebby | G02B 6/30 | 385/129 |
| 5,806,181 A * | 9/1998 | Khandros | H01R 43/16 | 29/840 |
| 6,093,042 A * | 7/2000 | Lemke | H01R 12/83 | 439/341 |
| 6,343,940 B1 * | 2/2002 | Khoury | G01R 1/06716 | 257/E23.004 |
| 6,527,597 B1 * | 3/2003 | Harper, Jr. | H01R 13/514 | 439/701 |
| 6,634,095 B2 * | 10/2003 | Colbert | H05K 7/1061 | 257/726 |
| 6,679,707 B1 * | 1/2004 | Brodsky | H05K 3/325 | 361/760 |
| 6,829,147 B2 * | 12/2004 | Streltsov | H01L 23/041 | 257/685 |
| 6,881,073 B2 * | 4/2005 | Bali | H01R 13/2414 | 439/594 |
| 6,951,490 B2 * | 10/2005 | De Faria | H01R 13/6315 | 439/717 |
| 6,971,887 B1 * | 12/2005 | Trobough | H05K 7/1092 | 439/71 |
| 7,037,116 B1 * | 5/2006 | Liao | H05K 7/1061 | 439/71 |
| 7,044,746 B2 * | 5/2006 | Copper | H01R 13/2442 | 439/66 |
| 7,059,869 B2 * | 6/2006 | Wertz | H01R 13/24 | 439/66 |
| 7,261,572 B2 * | 8/2007 | Zheng | H05K 7/1069 | 439/70 |
| 7,384,273 B1 * | 6/2008 | Polnyi | H01R 12/7052 | 439/526 |
| 7,419,383 B2 * | 9/2008 | Zheng | H05K 7/1069 | 439/71 |
| 7,473,106 B2 * | 1/2009 | Liao | H01R 12/7076 | 439/71 |
| 7,625,217 B1 * | 12/2009 | Liao | H01R 12/714 | 439/66 |
| 7,775,803 B2 * | 8/2010 | Gillespie | H01R 13/2435 | 439/66 |
| 7,874,875 B2 * | 1/2011 | Chang | H01R 43/0256 | 439/634 |
| 8,002,558 B2 * | 8/2011 | Liao | H05K 7/1061 | 439/65 |
| 8,074,354 B2 * | 12/2011 | Zheng | H05K 7/1069 | 29/874 |
| 8,267,701 B2 * | 9/2012 | Beaman | H01L 23/4006 | 439/68 |
| 8,998,623 B2 * | 4/2015 | Hsu | H05K 7/1053 | 439/70 |
| 9,368,890 B1 * | 6/2016 | Liao | H01R 12/7082 | |
| 9,660,403 B2 * | 5/2017 | Hochman | G09G 5/02 | |
| 9,766,268 B2 * | 9/2017 | Barabi | G01R 1/0483 | |
| 9,799,972 B2 * | 10/2017 | Su | H01R 12/52 | |

FOREIGN PATENT DOCUMENTS

| | | |
|---|---|---|
| CN | 201112656 | 9/2008 |
| CN | 102856670 A | 1/2013 |
| CN | 103647174 A | 3/2014 |
| CN | 204633005 U | 9/2015 |
| CN | 204706662 U | 10/2015 |
| CN | 205303808 U | 6/2016 |

* cited by examiner

ELECTRICAL CONNECTOR

CROSS-REFERENCE TO RELATED PATENT APPLICATION

This application claims priority to and the benefit of, pursuant to 35 U.S.C. § 119(a), patent application Serial No. CN201621259164.7 filed in China on Nov. 23, 2016. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector for receiving a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A chip module is necessary for daily-used intelligent products as it ensures the realization of the complicated functions of the intelligent products. Generally, thousands of terminals are arranged for an electrical connector connected with a chip module, and therefore a large enough insulating body is required. Correspondingly, multiple accommodating grooves are formed in the insulating body to accommodate the terminals. After being assembled to the insulating body, the terminals need to be soldered by a reflow oven, so that the electrical connector can be soldered to a circuit board. In this case, since the insulating body is large and the number of the terminals accommodated is great, warping of the insulating body can be caused, which is one of the greatest problems in the industry. When warping is serious, a part of the terminals in the insulating body cannot make electric contact with the circuit board nor with the chip module, thus causing various missing solder and solder skip phenomena, and the role of the electrical connector as a bridge for electric connection between the chip module and the circuit board cannot be realized.

To solve the problem, an electrical connector was developed in the industry. The electrical connector is provided with a plurality of body units, and each two adjacent body units are provided with dovetail grooves to realize embedded fixing, so that multiple body units can be spliced and fixed together. However, gaps may exist between the adjacent body units during splicing, and the body units may shake after splicing, so that the overall structure of the electrical connector is not firm, and flatness is poor, thereby directly affecting the electric connection with a chip module and a circuit board.

Therefore, a heretofore unaddressed need to design a novel electrical connector exists in the art to address the aforementioned deficiencies and inadequacies.

SUMMARY

An objective of the present invention is to provide an electrical connector, where two adjacent body units are provided with metal members and metal sheets for soldering and fixing, the overall structure is firm, and high flatness can be guaranteed.

To achieve the foregoing objective, certain embodiments of the present invention adopts the following technical solution.

An electrical connector includes: an insulating body, having at least two body units, each of the at least two body units accommodating and fixed with a plurality of terminals, and the at least two body units being spliced to each other, wherein each of the at least two body units has at least two edge portions, and the insulating body is provided with at least four fixing portions such that each of the at least two edge portions of each of the at least two body units is provided with at least one of the at least four fixing portions; at least four metal members, correspondingly and fixedly provided on the at least four fixing portions respectively; and at least two metal sheets, provided outside the at least two body units, wherein each of the at least two metal sheets is soldered and fixed to at least one metal member provided on each of the at least two body units.

In certain embodiments, the at least two metal sheets are integrally formed.

In certain embodiments, when the number of the body units is two and each of the body units has two fixing portions, the two fixing portions of each of the body units are provided on two opposite edge portions respectively.

In certain embodiments, when the number of the body units is three or more than three and each of the body units has two fixing portions, the two fixing portions of each of the body units are provided on two adjacent edge portions respectively.

In certain embodiments, for each of the edge portions provided with the corresponding fixing portions, the number of the fixing portions provided thereon is greater than one, and the corresponding metal sheet is soldered and fixed to the fixing portions provided thereon.

In certain embodiments, each of the metal members has a base, and two buckling portions are formed by bending and extending upward and downward respectively from the base toward a center of the corresponding body unit; and two grooves are respectively provided at an upper end and a lower end of each of the fixing portions correspondingly, and each of the two buckling portions is retained in a corresponding one of the two grooves.

In certain embodiments, the base of each of the metal members is flush with an outer side surface of each of the edge portions, or the base of each of the metal members protrudes out of the outer side surface of each of the edge portions; and the buckling portions close to upper surfaces of the edge portions are lower than or flush with the upper surfaces of the edge portions, and the buckling portions close to lower surfaces of the edge portions are higher than or flush with the lower surfaces of the edge portions.

In certain embodiments, the metal sheets are flat plate shaped, and the metal sheets are lower than or flush with upper surfaces of the edge portions and higher than or flush with lower surfaces of the edge portions.

In certain embodiments, each of the body units is provided with an insertion area located among the edge portions, the edge portions are higher than the insertion area to be configured to receive a chip module, each of the terminals is provided with a contact portion exposed to the insertion area, and the contact portion is configured to be in contact with the chip module.

An electrical connector includes: an insulating body, having at least two body units, each of the at least two body units accommodating and fixed with a plurality of terminals, and the at least two body units being spliced to each other, wherein each of the at least two body units has at least one edge portion, and the insulating body is provided with at least two fixing portions such that each of the at least one edge portion of each of the at least two body units is provided with at least one of the at least two fixing portions; at least two metal members, correspondingly and fixedly provided on the at least two fixing portions respectively; and at least one metal sheet, provided outside the at least two body units, wherein the at least one metal sheet is soldered and fixed to a metal member provided on each of the at least two body units.

In certain embodiments, each of the body units is provided with an insertion area located among the edge portions, each of the terminals is provided with a contact portion exposed to the insertion area, the contact portion is in contact with a chip module, and the edge portions are higher than the insertion area to be configured to receive the chip module.

In certain embodiments, each of the metal members has a base, and two buckling portions are formed by bending and extending upward and downward respectively from the base toward a center of the corresponding body unit; and two grooves are respectively provided at an upper end and a lower end of each of the fixing portions correspondingly, and each of the two buckling portions is retained in a corresponding one of the two grooves.

In certain embodiments, the base of each of the metal members is flush with an outer side surface of each of the edge portions, or the base of each of the metal members protrudes out of the outer side surface of each of the edge portions; and the buckling portions close to upper surfaces of the edge portions are lower than or flush with the upper surfaces of the edge portions, and the buckling portions close to lower surfaces of the edge portions are higher than or flush with the lower surfaces of the edge portions.

Compared with the related art, the electrical connector according to certain embodiments of the present invention has the advantage that: at least one fixing portion is provided on each edge portion of the two adjacent body units, the metal members are fixedly provided on the fixing portions, and the metal sheets and the metal members are soldered and fixed together, thereby avoiding the problems that the overall structure of the electrical connector is not firm and flatness is poor.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
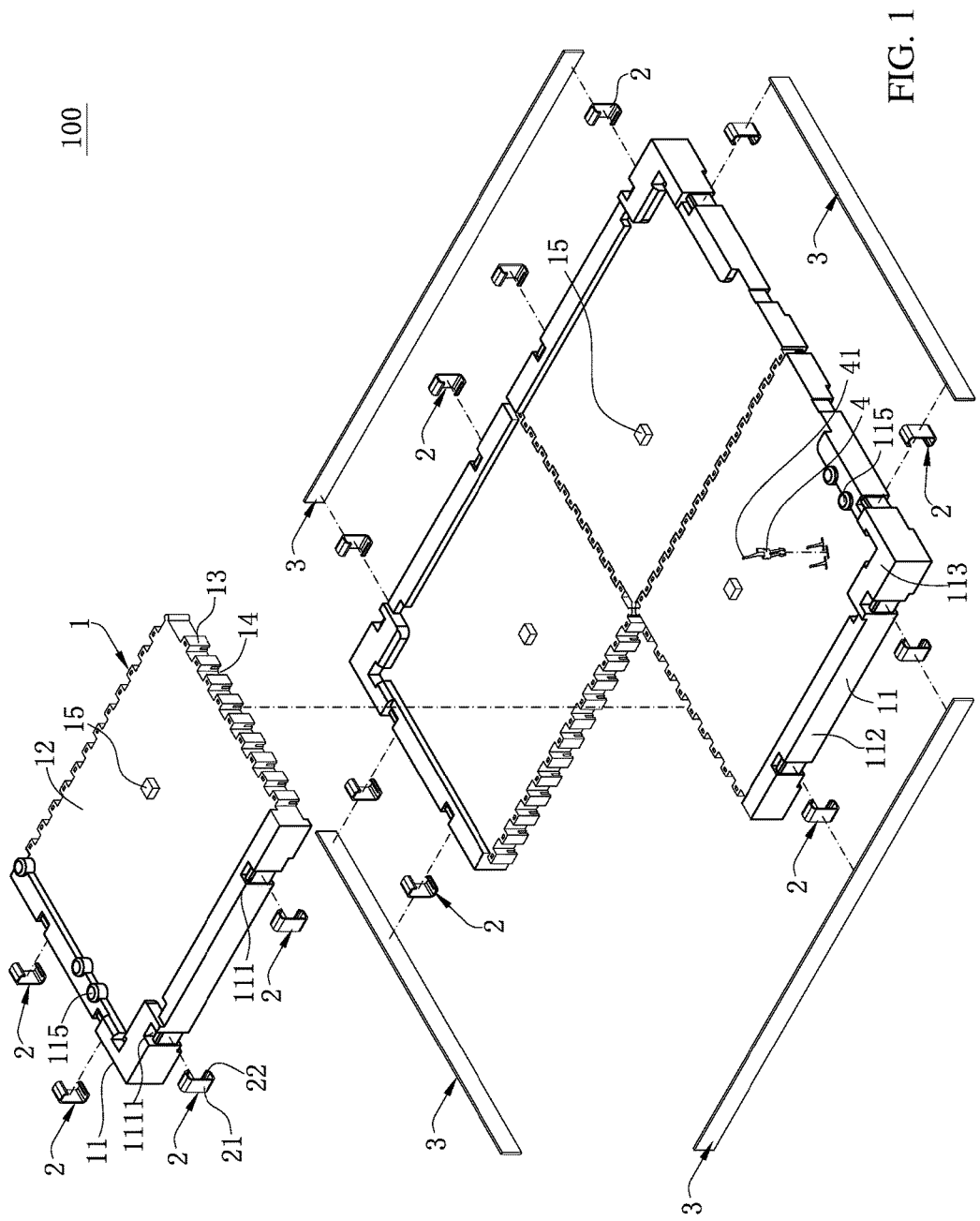
FIG. 1 is a schematic view of a single body unit according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-5B. In accordance with the purposes of this invention, as embodied and broadly described herein, this invention, in one aspect, relates to an electrical connector.

Figure 2:
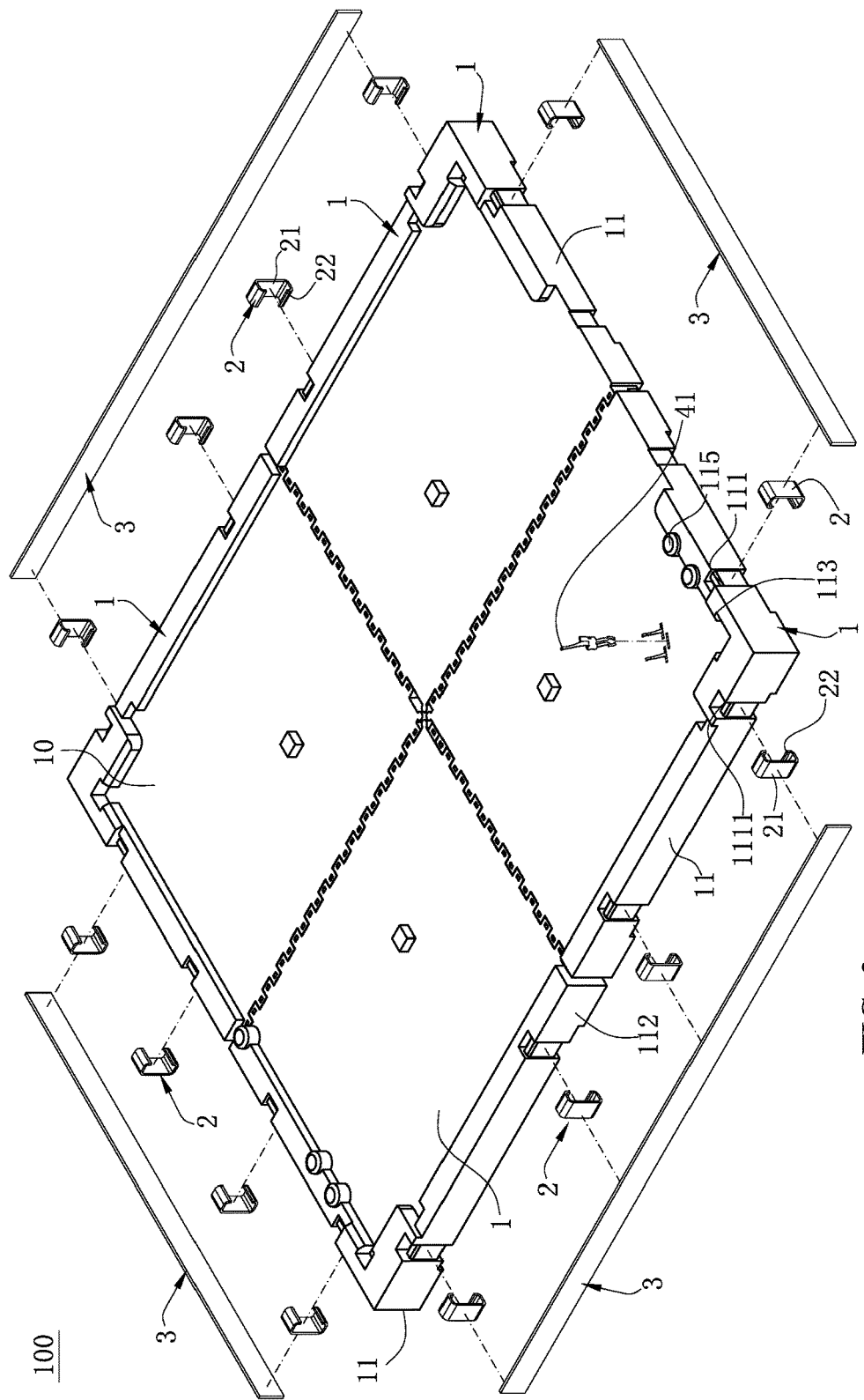
FIG. 2 is a schematic view of an assembly of an electrical connector according to certain embodiments of the present invention.
Figure 3A:
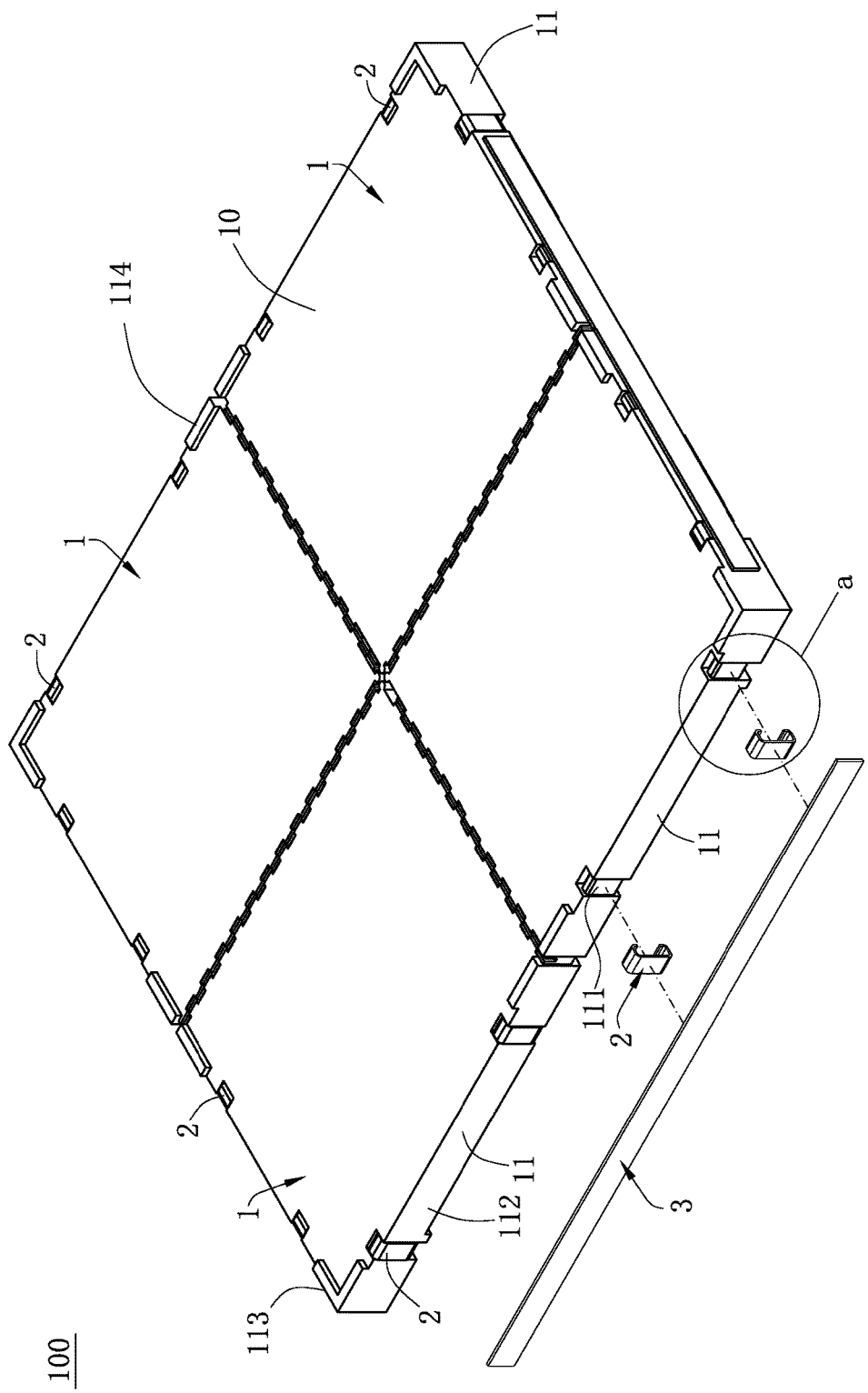
FIG. 3A is a schematic view of the back side of the electrical connector according to certain embodiments of the present invention.
Figure 3B:
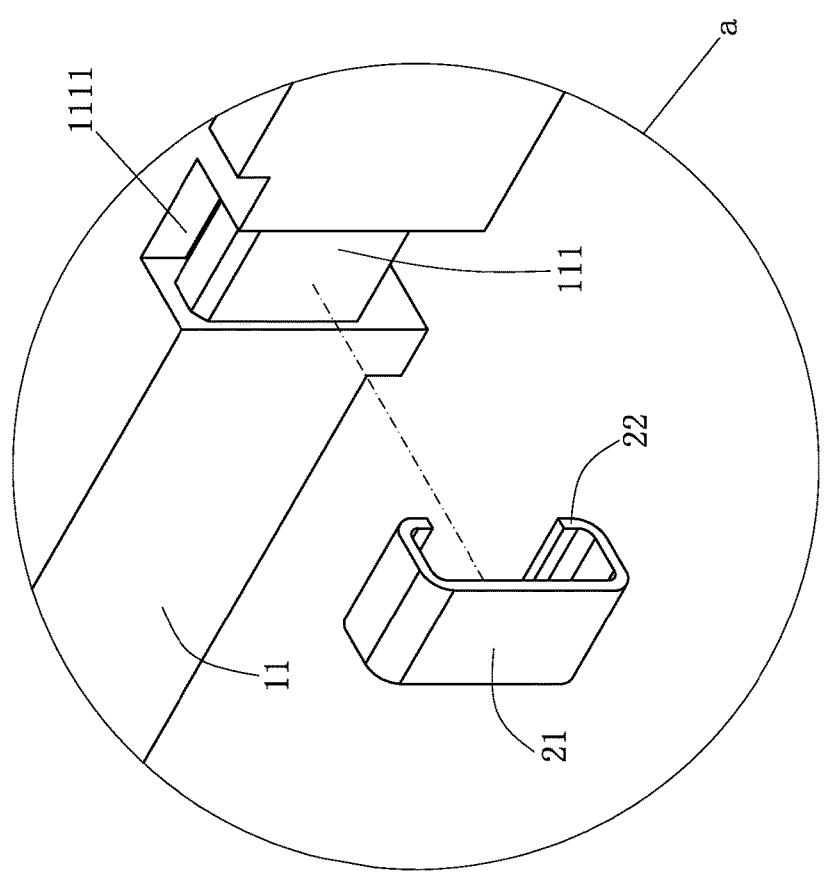
FIG. 3B is a local enlarged view of a part a in FIG. 3A.

FIG. 1 and FIG. 2 shows a preferred embodiment, in which an electrical connector 100 includes an insulating body 10. The insulating body 10 is formed by splicing four body units 1. Four metal members 2 are fixedly arranged on each body unit 1, and a metal sheet 3 is soldered and fixed to the four metal members 2.

As shown in FIGS. 1, 3A, 3B, 5A and 5B, each body unit 1 is provided with two adjacent edge portions 11. Each edge portion 11 is provided with two fixing portions 111. An upper end and a lower end of each fixing portion 111 are each provided with a groove 1111. Each edge portion 11 is provided with an outer side face 112, an upper surface 113 and a lower surface 114. Each body unit 1 is provided with an insertion area 12, which is located among the multiple edge portions 11, and the edge portions 11 are higher than the insertion area 12 to be used for receiving a chip module 200. Multiple terminals 4 are fixedly arranged in the insertion area 12. Each terminal 4 is provided with a contact portion 41 exposed from the insertion area 12, and the contact portion 41 is used for making contact with the chip module 200. Multiple protruding portions 13 are arranged on the side of each body unit 1 opposite to the edge portions 11 at intervals. A concave portion 14 is formed between each two protruding portions 13, and the protruding portions 13 protrude into the concave portions 14 of the adjacent body unit 1, so that the body unit 1 and the adjacent body unit 1 are embedded to each other. Four fool-proofing portions 115 are arranged on one side of the insulating body 10. The fool-proofing portions 115 are located on the edge portions 11 and protrude out of the edge portions 11 toward a center of the insulating body 10. Each body unit 1 is provided with a protruding block 15, and the protruding block 15 is not higher than the edge portions 11.

As shown in FIGS. 3A, 3B, 4A, 4B, 5A and 5B, each metal member 2 is provided with a base 21, and two buckling portions 22 are formed by bending and extending upward and downward respectively from each base 21 respectively towards a center of the corresponding body unit 1. Each buckling portion 22 is retained in a corresponding groove 1111. The base 21 of each metal member 2 is flush with an outer side surface 112 of each of the edge portions 11, or the base 21 of each metal member 2 protrudes out of the outer side surface 112 of each of the edge portions 11. The buckling portions 22 close to upper surfaces 113 of the edge portions 11 are lower than or flush with the upper surfaces 113 of the edge portions 11, and the buckling portions 22 close to lower surfaces 114 of the edge portions 11 are higher than or flush with the lower surfaces 114 of the edge portions 11.

Figure 4A:
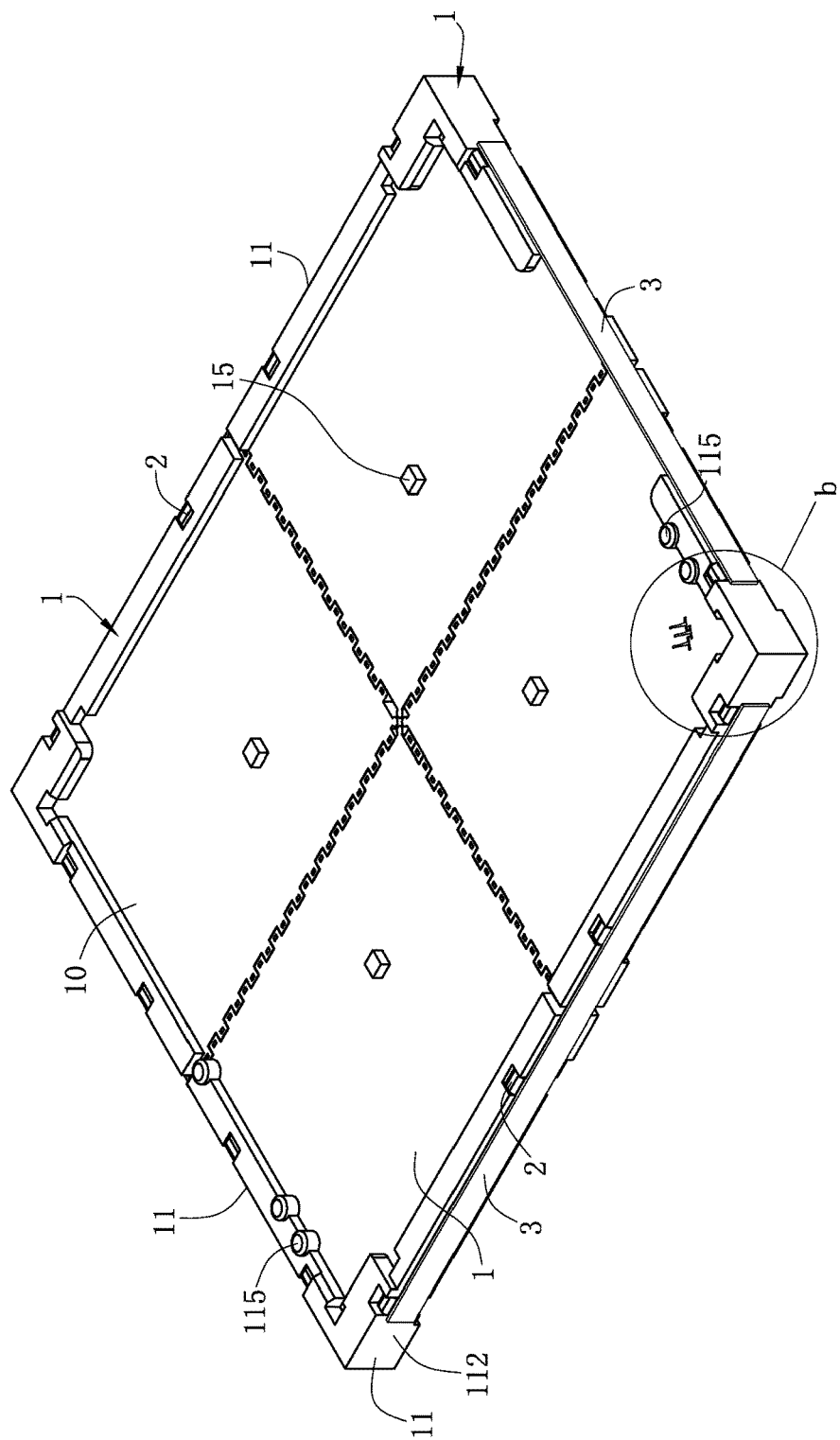
FIG. 4A is a schematic view of the electrical connector after assembly according to certain embodiments of the present invention.
Figure 4B:
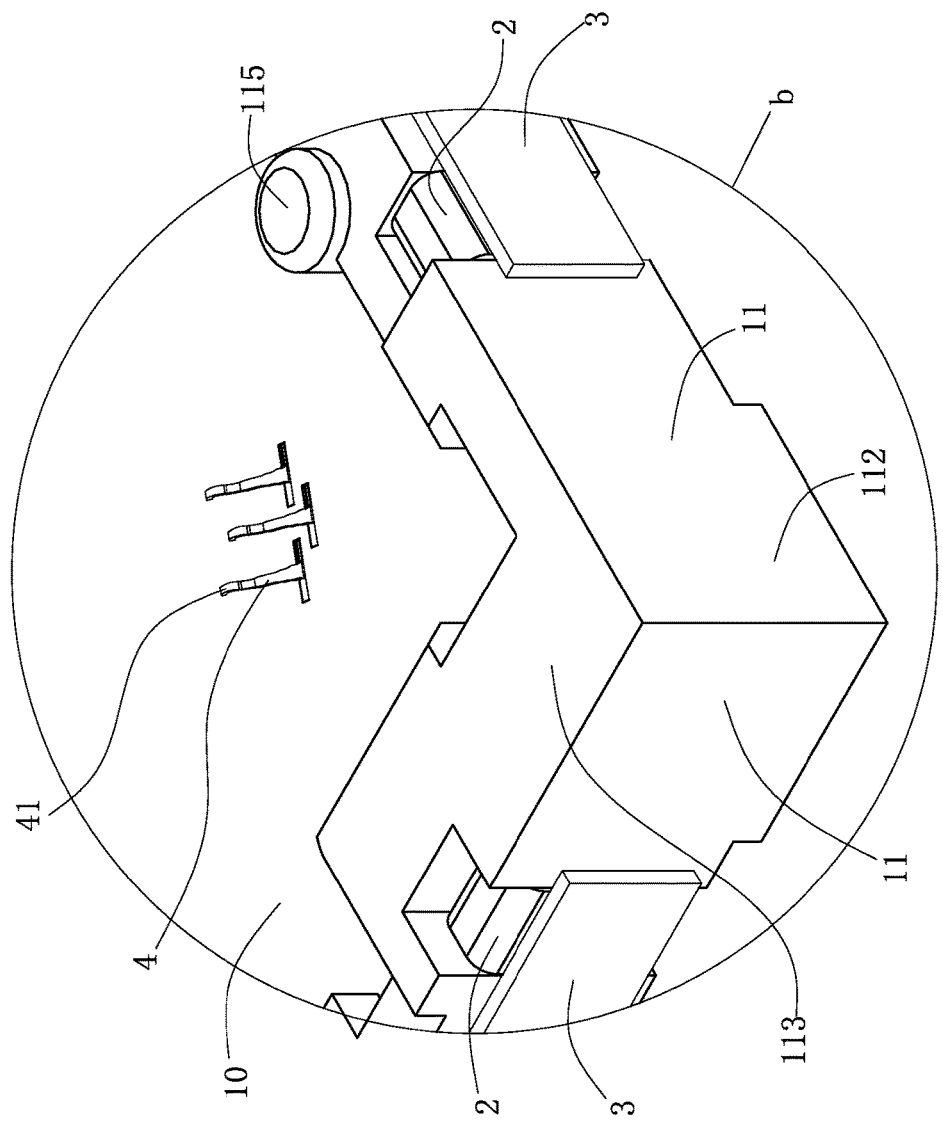
FIG. 4B is a local enlarged view of a part b in FIG. 4A.
Figure 5A:
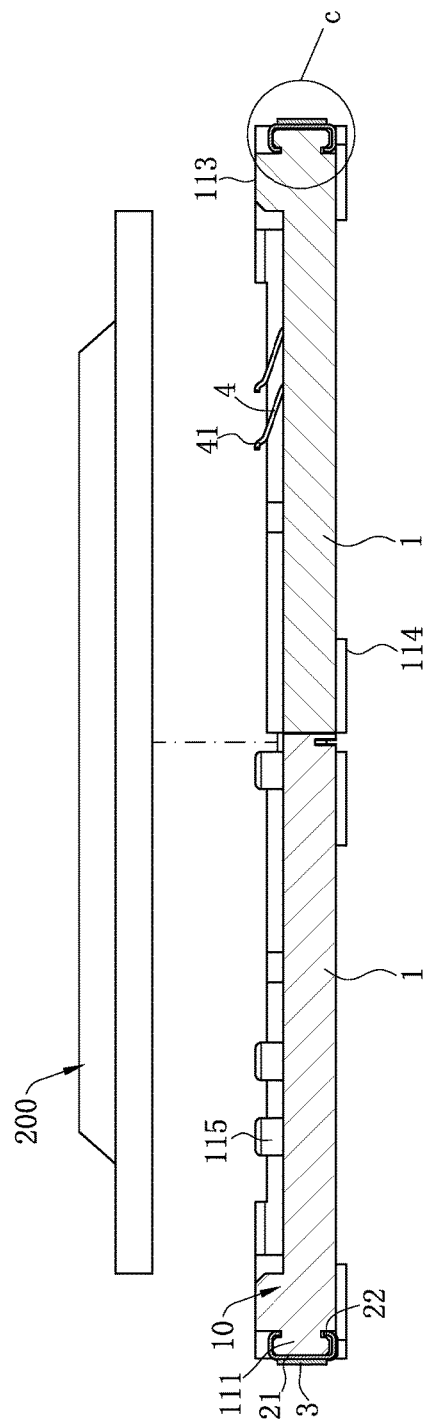
FIG. 5A is a schematic view of the electrical connector being matched with a chip module according to certain embodiments of the present invention.
Figure 5B:
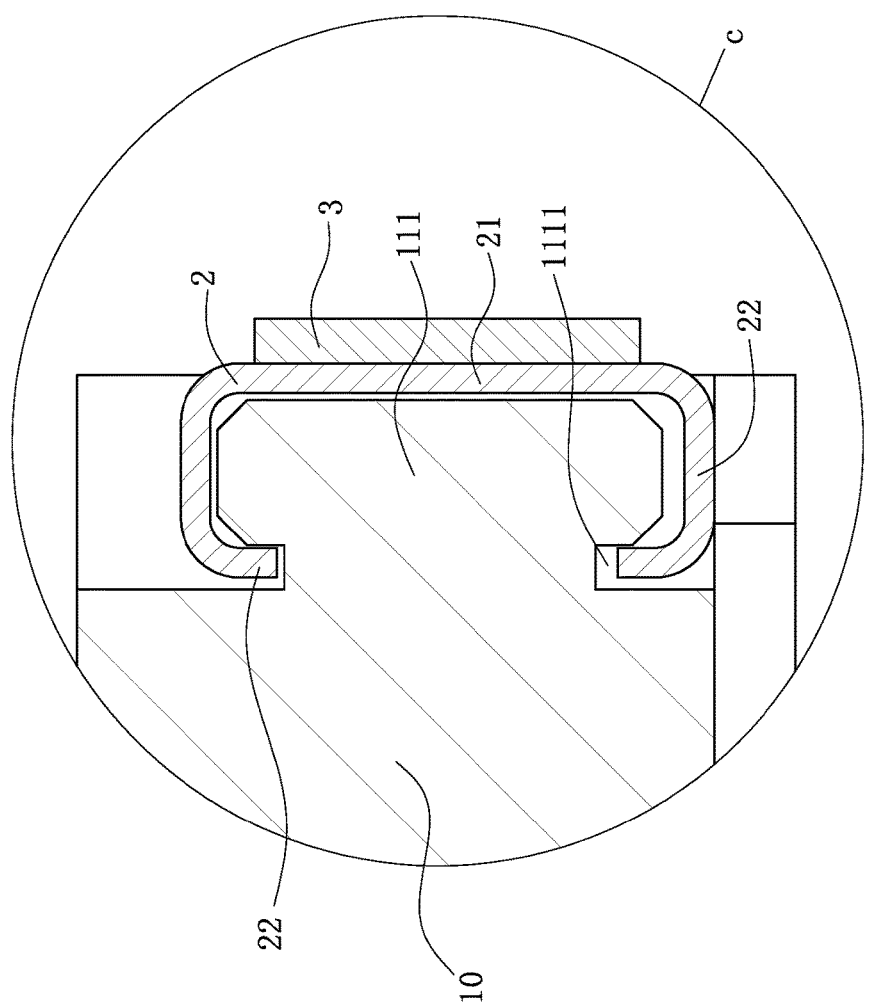
FIG. 5B is a local enlarged view of a part c in FIG. 5A.

As shown in FIGS. 2, 4A and 4B, after the body units 1 are spliced, one metal sheet 3 is provided on each of four sides thereof, and each metal sheet 3 covers two body units 1 and is soldered and fixed to two metal members 2 on each of the two body units 1. The metal sheets 3 are flat plate shaped, and the metal sheets 3 are lower than or flush with the upper surfaces 113 of the edge portions 11 and higher than or flush with the lower surfaces 114 of the edge portions 11.

As shown in FIGS. 2, 4A, 4B, 5A and 5B, during installation of the electrical connector 100, the metal members 2 are retained in the grooves 1111 firstly, then the protruding portions 13 of each body unit 1 are embedded with the concave portions 14 of the adjacent body unit 1 correspondingly. Finally, the metal sheets 3 are soldered to the metal members 2 correspondingly, so that each body unit 1 is firmly fixed by the metal sheets 3.

Compared with the related art, the electrical connector 100 according to certain embodiments of the present invention has the following beneficial effects:

1. The buckling portions 22 are retained in the grooves 1111. Compared with the technique that the metal members 2 and the body units 1 are integrally formed through injection molding directly, the number of procedures is reduced, operation is easy, and malposition of the metal members 2 generated during injection molding is avoided.

2. Each two adjacent body units 1 are embedded to each other, and then the metal sheets 3 and the metal members 2 are soldered and fixed together. Compared with the technique that each two adjacent body units 1 are directly embedded and fixed by dovetail grooves, the structure is firmer, shaking of the body units 1 after splicing is avoided, and the problem that flatness becomes poor is avoided.

3. The metal sheets 3 are lower than or flush with the upper surfaces 113 of the edge portions 11 and higher than or flush with the lower surfaces 114 of the edge portions 11. Thus, after the chip module 200 is received by the edge portions 11, the chip module 200 can be prevented from being scraped by the metal sheets 3. The buckling portions 22 close to the upper surfaces 113 of the edge portions 11 are lower than or flush with the upper surfaces 113 of the edge portions 11, and the buckling portions 22 close to the lower surfaces 114 of the edge portions 11 are higher than or flush with the lower surfaces 114 of the edge portions 11, thus avoiding friction between the metal members 2 and the chip module 200.

4. The metal sheets 3 are flat plate shaped, and the base 21 is flush with the outer side surface 112 of each of the edge portions 11, or the base 21 protrudes out of the outer side surface 112 of each of the edge portions 11, so that the metal sheets 3 can be easily welded to the corresponding metal members 2.

5. After the body units 1 are spliced, one metal sheet 3 is provided on each of four sides, and the insulating body 10 is surrounded by the metal sheets 3, so that the body units 1 can be protected by the metal sheets 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   an insulating body, having at least two body units, each of the at least two body units accommodating and fixed with a plurality of terminals, and the at least two body units being spliced to each other, wherein each of the at least two body units has at least two edge portions, and the insulating body is provided with at least four fixing portions such that each of the at least two edge portions of each of the at least two body units is provided with at least one of the at least four fixing portions;
   at least four metal members, correspondingly and fixedly provided on the at least four fixing portions respectively; and
   at least two metal sheets, provided outside the at least two body units, wherein each of the at least two metal sheets is soldered and fixed to at least one metal member provided on each of the at least two body units.

2. The electrical connector according to claim 1, wherein the at least two metal sheets are integrally formed.

3. The electrical connector according to claim 1, wherein when the number of the body units is two and each of the body units has two fixing portions, the two fixing portions of each of the body units are provided on two opposite edge portions respectively.

4. The electrical connector according to claim 1, wherein when the number of the body units is three or more than three and each of the body units has two fixing portions, the two fixing portions of each of the body units are provided on two adjacent edge portions respectively.

5. The electrical connector according to claim 1, wherein for each of the edge portions provided with the corresponding fixing portions, the number of the fixing portions provided thereon is greater than one, and the corresponding metal sheet is soldered and fixed to the fixing portions provided thereon.

6. The electrical connector according to claim 1, wherein:
   each of the metal members has a base, and two buckling portions are formed by bending and extending upward and downward respectively from the base toward a center of the corresponding body unit; and
   two grooves are respectively provided at an upper end and a lower end of each of the fixing portions correspondingly, and each of the two buckling portions is retained in a corresponding one of the two grooves.

7. The electrical connector according to claim 6, wherein:
   the base of each of the metal members is flush with an outer side surface of each of the edge portions, or the base of each of the metal members protrudes out of the outer side surface of each of the edge portions; and
   the buckling portions close to upper surfaces of the edge portions are lower than or flush with the upper surfaces of the edge portions, and the buckling portions close to lower surfaces of the edge portions are higher than or flush with the lower surfaces of the edge portions.

8. The electrical connector according to claim 1, wherein the metal sheets are flat plate shaped, and the metal sheets are lower than or flush with upper surfaces of the edge portions and higher than or flush with lower surfaces of the edge portions.

9. The electrical connector according to claim 1, wherein each of the body units is provided with an insertion area located among the edge portions, the edge portions are higher than the insertion area to be configured to receive a chip module, each of the terminals is provided with a contact portion exposed to the insertion area, and the contact portion is configured to be in contact with the chip module.

10. An electrical connector, comprising:
    an insulating body, having at least two body units, each of the at least two body units accommodating and fixed with a plurality of terminals, and the at least two body units being spliced to each other, wherein each of the at least two body units has at least one edge portion, and the insulating body is provided with at least two fixing portions such that each of the at least one edge portion of each of the at least two body units is provided with at least one of the at least two fixing portions;
    at least two metal members, correspondingly and fixedly provided on the at least two fixing portions respectively; and
    at least one metal sheet, provided outside the at least two body units, wherein the at least one metal sheet is soldered and fixed to a metal member provided on each of the at least two body units.

11. The electrical connector according to claim 10, wherein each of the body units is provided with an insertion area located among the edge portions, each of the terminals is provided with a contact portion exposed to the insertion area, the contact portion is in contact with a chip module, and the edge portions are higher than the insertion area to be configured to receive the chip module.

12. The electrical connector according to claim 10, wherein:
    each of the metal members has a base, and two buckling portions are formed by bending and extending upward and downward respectively from the base toward a center of the corresponding body unit; and
    two grooves are respectively provided at an upper end and a lower end of each of the fixing portions correspondingly, and each of the two buckling portions is retained in a corresponding one of the two grooves.

13. The electrical connector according to claim 12, wherein:
    the base of each of the metal members is flush with an outer side surface of each of the edge portions, or the base of each of the metal members protrudes out of the outer side surface of each of the edge portions; and
    the buckling portions close to upper surfaces of the edge portions are lower than or flush with the upper surfaces of the edge portions, and the buckling portions close to lower surfaces of the edge portions are higher than or flush with the lower surfaces of the edge portions.

* * * * *